United States Patent [19]
Mayr et al.

[11] Patent Number: 6,160,323
[45] Date of Patent: Dec. 12, 2000

[54] SAFETY SWITCHING DEVICE FOR ELECTRICALLY CONTROLLED MACHINES

[75] Inventors: Franz Mayr, Alberndorf; Hans-Peter Wintersteiger, Hagenberg, both of Austria

[73] Assignee: Keba Gesellschaft m.b.H. & Co., Linz, Austria

[21] Appl. No.: 09/264,752

[22] Filed: Mar. 9, 1999

[30] Foreign Application Priority Data

Mar. 13, 1998 [AT] Austria ....................................... 449/98

[51] Int. Cl.⁷ .................................................. H01L 29/82
[52] U.S. Cl. ............................................................ 307/116
[58] Field of Search .................................. 307/326, 327, 307/328; 192/129 R, 130, 131, 129 A; 200/47

[56] References Cited

U.S. PATENT DOCUMENTS

| | | | |
|---|---|---|---|
| 4,575,781 | 3/1986 | Weber | 361/380 |
| 4,618,823 | 10/1986 | Dahlheimer et al. | 324/207 |
| 4,652,205 | 3/1987 | Ross et al. | |
| 4,812,674 | 3/1989 | Sue et al. | 307/116 |
| 4,814,632 | 3/1989 | Glaeser et al. | |
| 5,280,622 | 1/1994 | Tino | |

FOREIGN PATENT DOCUMENTS

| | | |
|---|---|---|
| 32 42 256 | 5/1984 | Germany. |
| 0 264 350 | 4/1988 | Germany. |
| 42 10 661 | 10/1993 | Germany. |

*Primary Examiner*—Josie Ballato
*Assistant Examiner*—Robert L. DeBeradinis
*Attorney, Agent, or Firm*—Collard & Roe, P.C.

[57] ABSTRACT

The invention relates to a safety switching device (1) for electrically controlled machines, for use in combination with the control elements of the machine control-system itself during manual operation, in which the multi-action safety switching device (1) has several channels or several switching circuits (7, 8) and the switching circuits have at least one operating element (2, 3) which can be adjusted by an operator depending on the desired switching function. Each switching circuit (7, 8) has at least one position-sensing device (14, 15), comprising in particular contactless detection devices (16, 17) for detecting, at any time, the position (4 to 6) of the operating elements (2, 3) corresponding to the respective switching stages, which can be adjusted by the operator.

34 Claims, 2 Drawing Sheets

SAFETY SWITCHING DEVICE FOR ELECTRICALLY CONTROLLED MACHINES

BACKGROUND OF THE INVENTION

1. Field of the invention

The invention relates to a safety switching device for electrically controlled machines used in combination with the control elements of the machine control-system itself during hand or manual operation, in which the multi-action safety switching device has several channels or several switching circuits and the switching circuits have at least one operating element which can be adjusted by an operator depending on the desired switching function.

2. The Prior Art

Various safety switching devices, also known as starter switches, are already known. These starter switches are designed in the form of a plurality of individual make-and-break contacts arranged on spring contacts. Several operating members are assigned to these mechanical make-and-break contacts in order to adjust their position relative to one another and enable an electrical contact to be made or broken between two co-operating switch contacts. In order for these switch contacts to comply with the requirements placed on safety switching elements, a complex mechanism has to be provided to prevent specific inadmissible switching states. The disadvantage of the known devices is that these mechanical operating members require an expensive mechanical design in order to prevent inadmissible switching sequences.

SUMMARY OF THE INVENTION

The underlying objective of the present invention is to provide a safety switching device offering a high degree of operating safety.

Said objective of the invention is achieved due to the fact that each switching circuit has at least one position-sensing device, comprising in particular contactless detection devices for detecting, at any time, the position of the operating elements corresponding to the respective switching stages, which can be adjusted by the operator. The advantage which this system surprisingly brings resides in the fact that the safety switching device is of a significantly smaller construction than known mechanical solutions, which means that very compact hand terminals can be made as a means of operating machinery or robots. Although comparably small, these safety switching devices are not problematic to manufacture because only very simple mechanical components are needed, requiring low tolerances since they will have to transmit relatively small forces only. The safety switching device proposed by the invention obviates the need for complex guide tracks and/or linkages between individual components, which means that the mechanical components provide a high degree of operating safety without the need for particularly strong or expensive materials. In addition, the safety switching device eliminates the need for various switching contacts for galvanic connections, avoiding sparking or wear on the switching contacts, nor will peripheral electrical components be affected by electromagnetic interference. Due to the fact that the safety switching device is largely of a contactless design, the occurrence of wear and tear on the mechanical components can be virtually ruled out, thereby ensuring a long service life without disruptions of any kind. Another advantage is that any faults which occur in one of the circuits of the electric safety switching device can be detected without problem and indicated so that the safety switching device can be repaired or replaced immediately. In particular, an individual fault can be picked up at least on the next cycle, which means that the occurrence of an individual fault will not jeopardise safety.

In one advantageous embodiment, each switching circuit is assigned at least one electronic evaluating device for detecting or determining positions of at least one operating element, which can be adjusted by the operator, the evaluation operations of the evaluating devices being independent of one another. The surprising advantages to be had from this combination of features is that because of the predominantly electrical design of the safety switching device, the evaluating devices of the safety switching device can be set up in a decentralised layout relative to the operating elements and position-sensing devices, since a simple cable connection can be used to bridge comparably large distances without problem. Consequently, the actual input unit comprising the operating elements and the position-sensing devices co-operating therewith consist of relatively small components, which can be integrated using simple means to provide a compact unit. The relevant electronic evaluating device can be arranged at a distance apart on its own component board but can also be disposed on a single circuit board together with the electrical components of the manual operating device for the machine, which saves on costs and reduces the amount of mounting space needed. Operating safety can also be enhanced by opting for a safety switching device of a multi-circuit design. Since the safety switching device is largely electrical in design, it also provides a simple option for taking account of special situations in terms of switching states. For example, it provides a simple and reliable method of ruling out denial of a brief, non-permitted start authorisation once the system is switched to emergency status.

Another advantage is that at least two position-sensing devices are assigned to each switching circuit, which on the one hand provides a redundancy system which will guarantee the operating safety of the safety switching device even if one of the individual components breaks down. In addition, it readily enables the adjustment position of the operating elements to be ascertained in a very safe manner.

Of particular advantage is another embodiment in which the evaluating devices are built using electrical parts or components based on different technologies and/or the evaluating device of the first switching circuit is of a different circuit design from the second switching circuit, which means that the electrical components of the first switching circuit can be distinguished from the electrical components of the second switching circuit on the one hand by the differing technology and methodology and/or on the other by the basic circuit structure. Consequently, environmental influences will not be able to generate multiple faults and the two circuits can never be affected at the same time, thereby providing safety of a single-mode standard.

Another advantageous feature is the fact that each switching circuit has its own independent operating element built-in, so that if an operating element breaks or is damaged, at least one other operating element is provided to prevent a total stoppage of operations.

Another advantage is the fact that the operating elements are kinetically coupled with one another so that all available switching circuits of the safety switching device are constantly in use, thereby enhancing safety.

By designing the safety switching device so that the position-sensing devices are provided in the form of optical detection devices, the position-sensing devices will be highly insensitive to interference, which will provide a high degree of safety, particularly in environments susceptible to electromagnetic disturbances.

The embodiment of the safety switching device which uses light sensors as the position-sensing devices provides a high degree of reliability because many of the electrical components used are standard and readily available.

The advantageous embodiment of the safety switching device in which the position-sensing devices assigned to the first operating element, provided specifically in the form of first light sensors, and/or the position-sensing devices assigned to the other operating element, specifically provided in the form of other light sensors, are arranged in succession following a direction in which the operating elements are adjusted, provides a simple system that is capable of detecting an adjustment direction of the operating elements, making it absolutely obvious from which switching stage the system was switched to the current switching stage. In addition, the multiple layout of the position-detecting devices or light sensors significantly enhances operating safety.

The embodiment of the safety switching device in which each operating element has a plate-type sliding member with an orifice and/or in which the sliding members operate as optical apertures and are mounted so that they can be adjusted relative to their respective light sensors, offers the advantage that these components are simple to manufacture and work on the basis of a functionally safe principle of physics.

In one embodiment of the safety switching device, each evaluating device is connected respectively to at least one electric switching element on the output side, which means that the evaluation results of the evaluating device can be applied to the requisite switching function with a low power requirement.

However, another advantageous embodiment is the safety switching device in which each evaluating device has a start output and an emergency stop output, since this provides a multi-function safety switching device which can be used as a starter switch on the one hand and as an emergency stop device on the other.

By virtue of one embodiment of the safety switching device, in which the start output and the emergency stop output of each evaluating device is connected to a respective switching element, the safety switching device has several outputs, each independent of the others, so that either several switching circuits can be set up independently of one another or, alternatively, these switching outputs can be combined as a means of increasing operating safety.

In another advantageous embodiment of the safety switching device, a protective circuit is assigned to at least one of the switch elements to provide protection against overload and/or short-circuit currents and/or the protective circuit monitors the electric power conducted across the switch elements and is connected to the evaluating devices and/or the start and/or emergency stop outputs thereof to prevent damage to the safety switching device which might be caused by interference in the peripheral electric switching circuits of the machine, thereby offering a level of protection comparable with mechanical switching contacts.

Also of advantage is an embodiment of the safety switching device in which the switch elements of the first switching circuit are built using a different technology from that used for the second switching circuit, since this will prevent external environmental influences, such as disruptive electric fields, for example, from causing multiple faults or having a knock-on effect.

However, there is also an advantage to be had if switching elements are built using contactless switching members, in particular semiconductor components, since these will produce very short switching times, keeping energy requirements comparably low.

In the design in which the switch elements of the first switching circuit are provided in the form of bipolar transistors and the switch elements of the second switching circuit are provided as field-effect transistors, there is the advantage that these switch elements are readily available as standard components, thereby incurring relatively low costs.

In another embodiment of the safety switching device, the switch elements are provided as semiconductor elements and constitute a device which sets a standard flow direction of the switching current across the switching elements and/or a device which sets the polarity of the switching current applied to the switch elements and/or the device comprises a plurality of semiconductor diodes in a bridge arrangement. The advantage of this is that the switching outputs are essentially floating outputs so that when a safety switching device is incorporated in existing current circuits, there is no need to take account of a specific polarity, thereby reducing the risk of incorrect assembly.

In one embodiment, the device comprises two pairs of diodes connected in the same direction of current throughput and the switching element assigned to the two pairs of diodes is connected in parallel and/or each pair of diodes is respectively provided in the form of semiconductor diodes connected in the direction of throughput and switching outputs are set up between the serially connected semiconductor diodes of each pair of diodes. This provides a reliable polarity matching device requiring only a few components and which is also available in integrated form.

In the embodiment in which the electronic evaluating device of the first switching circuit is of a different technological design from that of the evaluating device of the second switching circuit and/or the first switching circuit has an analogue evaluating device and the second switching circuit has a digital evaluating device for the electric signals applied to the signal outputs of the position-sensing devices, in particular light sensor signals, the safety switching device is capable of meeting high safety standards since external environmental influences will prevent the risk of common mode failure.

An advantageous embodiment of the evaluating device is one in which one of the electronic evaluating devices has at least one threshold circuit and/or a Schmitt trigger circuit, since this enables broadband switching hysteresis which helps to promote reliable transmission of the evaluation results.

In one embodiment, in which the other electronic evaluating device has a plurality of digital gate arrays for evaluating the signals of the position-sensing devices and/or one of the electronic evaluating devices consists of a freely programmable gating system with an evaluating logic programmed accordingly, an advantage is to be had in that the evaluating device can be built in a very compact structure and will achieve very short reaction times.

In another embodiment, in which the position-detection devices consist of inductive and/or capacitative and/or pressure-sensitive or piezoelectric detection devices, the design can be optimised to suit environmental conditions.

Advantages are to be had from another embodiment, in which the switching elements of the first switching circuit and the second circuit assigned to the emergency stop outputs are connected to operate in series so that in the event of a failure of one emergency stop output the other emergency stop output can take over switching down of the machine.

In the embodiment in which the switching elements assigned to the start outputs of the first switching circuit and the second circuit are connected in parallel, one advantage is that if one start output fails, the other start output will carry out the requisite switching function correctly.

The design of the safety switching device in which parallel-connected switching elements are connected to the serially connect switch elements and at least one actuator, e.g. a relay, is connected to or isolated from a current supply across this switching system, provides an advantageous means of incorporating active positioning members in the corresponding electric switching circuits to meet specific requirements.

BRIEF DESCRIPTION OF THE DRAWINGS

The invention will be described in more detail below with reference to the embodiments depicted in the drawings. Of these.

DETAILED DESCRIPTION OF PREFERRED EMBODIMENTS

Firstly, it should be pointed out that the same reference numbers and names are given to parts which are common to the embodiments described, so that the disclosures made throughout the description can be transposed in terms of meaning to common parts bearing the same reference numbers or same component names. The same terms used in the description to denote layout, e.g. top, bottom, to the side, etc. apply to the drawing being described and illustrated and, when another position is described, can be literally applied to the new position. Furthermore, individual characteristics or combinations of characteristics from the different embodiments described and illustrated may be regarded as solutions to the objective of the invention or as proposed for the purposes of the invention in their own right.

Figure 1:
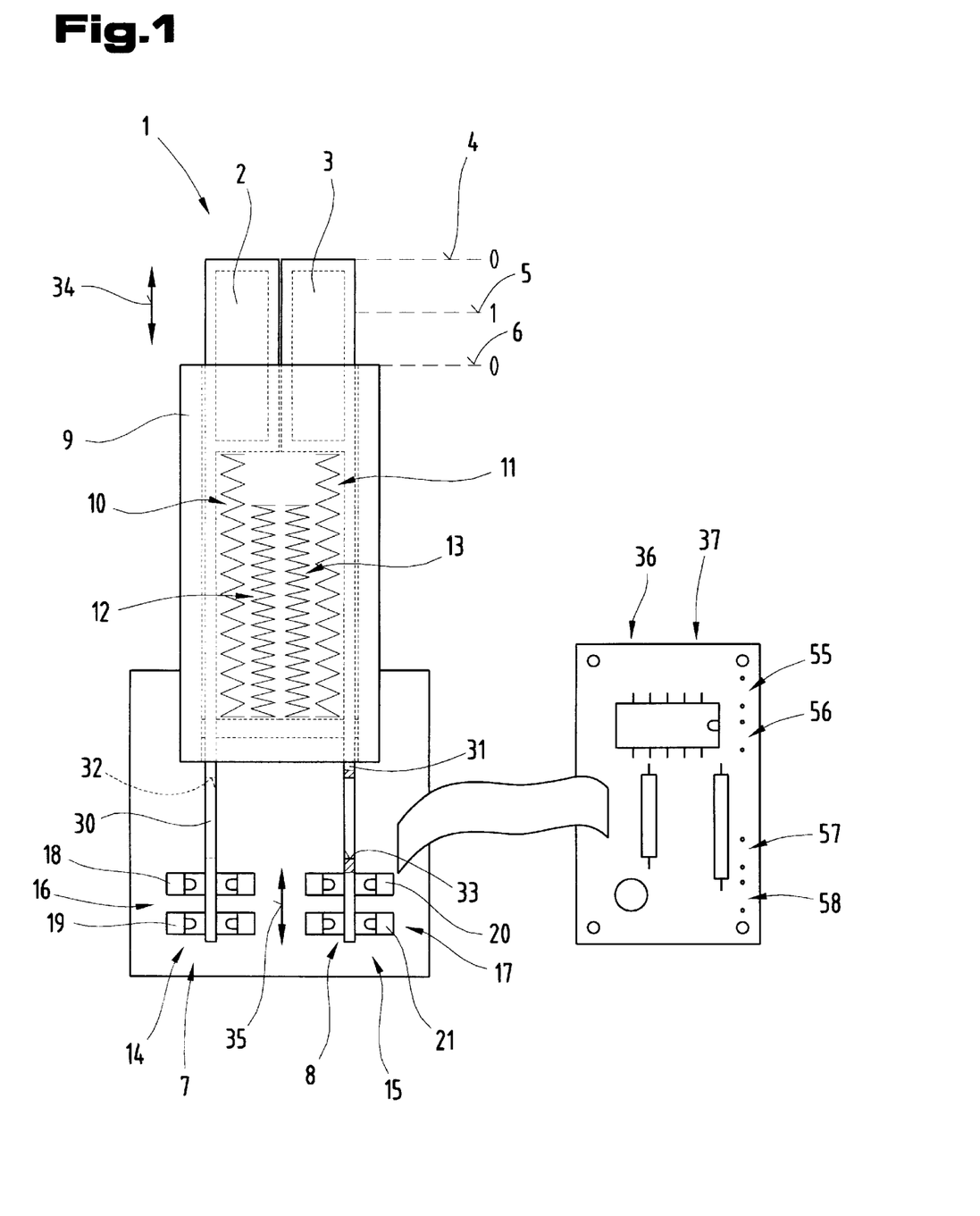
FIG. 1 is one embodiment of the structure of the safety switching device proposed by the invention, in a very simplified representation.
Figure 2:
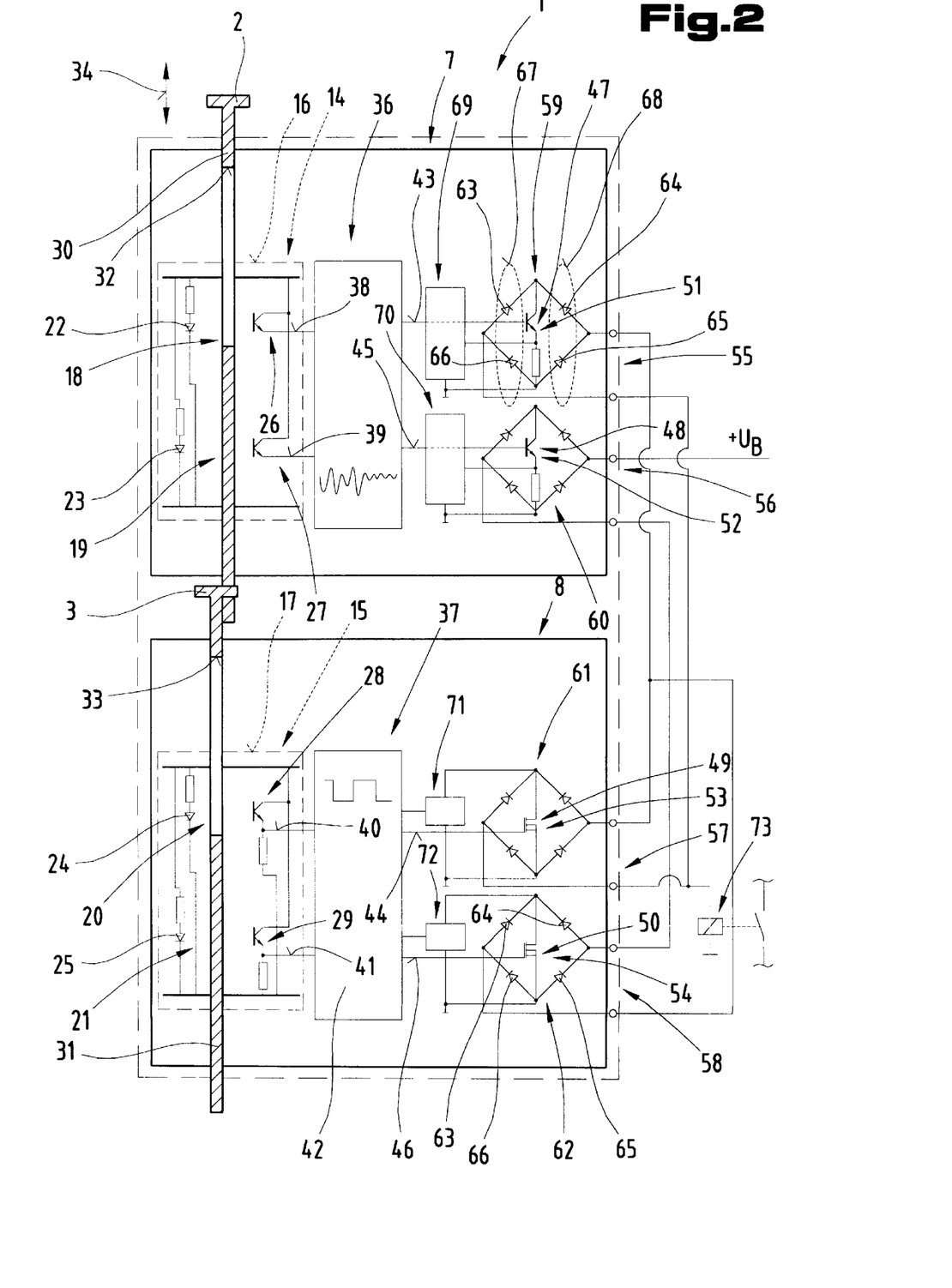
FIG. 2 is a very simplified block diagram of the electronic components and an operating diagram of the operating elements of the safety switching device which can be operated by the user.

For the sake of clarity, the structure and manner of operation of the safety switching device 1 proposed by the invention are described and illustrated in a very simplified format in FIGS. 1 and 2, FIG. 1 showing one particular embodiment in terms of structure and design and FIG. 2 giving a block diagram, in which the push-button operating elements 2, 3 which can be used by the user are also included in order to clarify the mode of operation.

The safety switching device 1 proposed by the invention is provided as a means of controlling machines and robots in combination with the actual control elements thereof and is used in particular for manually controlling the positioning and functional procedures of a machine. Accordingly, the safety switching device 1 proposed by the invention may be used for manually operating a multi-axial robot arm or a multi-axial processing machine. The safety switching device 1 is therefore designed to be used in combination with the control members operated by the user, such as, for example, a control column, a control ball or trackball or similar, whereby the machine does not perform the movement intended by the operator unless the safety switching device 1 is operated in a predefined manner. The safety switching device 1 can therefore be likened to a starter device and can be built into a manual operating device for the machine or incorporated as a switching column or similar.

The safety switching device 1 can be used, for example, during what are referred to as "teach in" procedures or learning processes for robots, during which the positioning procedure to be carried out by the robot arm is predetermined beforehand by means of manual operation so that the robot will subsequently perform the positioning procedure predetermined by the manual operation independently.

The safety switching device 1 is therefore provided as a pushbutton in particular, i.e. the switching status initiated by the user will be maintained only as long as the safety switching device 1 is actively operated.

The safety switching device 1 proposed by the invention is connected in series with the standard control members on the manual operating device for the machine. In other words, the machine performs the function intended by the operator only if the safety switching device 1 is operated in such a way, preferably with the user's other hand, that authorisation to carry out the function is issued. The safety switching device 1 therefore assumes an authorisation function as well as a safety function, since inadvertently activated operation of the control member for the machine, caused by slipping for example, will not allow uncontrolled movements or functions of the machine to be carried out.

In addition, the safety switching device 1 may have an emergency stop button, designed to produce a very high degree of operating safety or reliability, which will operate to a particularly high safety standard in the event of an emergency situation.

The safety switching device 1 therefore ensures a high degree of operating safety on the one hand. On the other hand, the safety switching device 1 also minimises the risk of injury to persons or the risk of machine components being damaged, enabling relatively safe operation of the corresponding machines.

The safety switching device 1 is of a multi-action design and has at least two switching stages, optionally also three switching stages—positions 4 to 6. In the first switching stage—position 4—in which the safety switching device 1 is not operated by the user, there is no authorisation for any movement of a machine component or operation of a critical function. In the second switching stage—position 5—the safety switching device 1 is preferably operated by the user's finger so that authorisation for a displacement or functional operation of the machine is issued. Authorisation is valid only for as long as the operating elements 2, 3 continue to be held depressed in the second switching stage—position 5. Once the operating elements 2, 3 are released, they immediately return to the first switching stage—position 4—so that authorisation is again suppressed. The safety switching device 1 therefore operates exclusively on a pushbutton principle without any latching or setting of switch positions.

Depending on the circumstances, the safety switching device 1 may also be of a triple-action design, in which case when the operating elements 2, 3 are moved into the third switching stage—position 6—no authorisation is issued for the machine to perform any movements or functions. This third switching stage—position 6—can be triggered in particular if an operator reacts in a panic, sensing impending danger, and frantically operates the safety switching device 1 and the operating elements 2, 3 are pushed beyond the second switching stage—position 5.

No further authorisation for a machine component to move or for a machine to perform a function can be given until the operating elements 2, 3 have been fully released and depressed again until the second switching stage—position 5—is reached. As the operating elements 2, 3 are moved through the positions, starting from the third switching stage—position 6—via the second switching stage—position 5—into the first switching stage—position 4—no authorisation will be issued by the safety switching device 1, even for a brief period, so that the machine can not be activated under any circumstances—not even briefly—if the operating elements 2, 3 have been pushed into the third switching stage—position 6—and then released again.

Regardless of whether the safety switching device 1 is of a twin or a multi-action design, it will incorporate this multiple-channel or multiple-circuit arrangement so that if one electric circuit fails, at least one other electric circuit will be available avoiding total shutdown of the safety switching device 1. The safety switching device 1 therefore falls within the category of what are referred to as "single-mode safety" switches, the operating safety of which is markedly higher than that of conventional switching elements. The safety switching device 1 therefore incorporates at least two electric switching circuit, 7, 8, each of the operating elements 2, 3 provided having its own switching circuit 7, 8. The first switching circuit 7 is specifically assigned to the operating element 2 and is set up to detect the respective positions thereof and convert this position data into clearly distinguishable electric signals. The other switching circuit 8, by contrast, is assigned to the other operating element 3 and is also set up to detect its position and convert the respective position into corresponding, clearly distinguishable electric signals.

The operating elements 2, 3 of the safety switching device 1 are preferably adjusted simultaneously when the operator is operating the safety switching device 1. In particular, the two operating elements 2, 3 have a coupling system or a cap connecting the two operating elements 2, 3 so that when one of the operating elements 2, 3 is depressed by the user all other operating elements 2, 3 are moved simultaneously with it.

The operating elements 2, 3 are retained in an enclosure 9 of the safety switching device 1. The enclosure 9 simultaneously has guide tracks for guiding the operating elements 2, 3 in a largely backlash-free motion. The operating elements 2, 3 are preferably displaced in translation in order to perform a switching function. Clearly, however, it would also be possible to use rotary or a combination of rotary and/or linear displacements with the operating elements 2, 3 as a means of activating the desired switching function.

At least one resilient element 10, 11 is assigned to the operating elements 2, 3 so that a certain degree of mechanical resistance acts against an adjustment of the operating elements 2, 3. By preference, the resilient elements 10, 11 apply a certain degree of pre-biasing tension to the operating elements 2, 3 so that they are retained in the initial or rest position during the first switching stage—position 4—and can not be shifted into the second switching stage—position 5—until they have overcome a certain degree of mechanical resistance determined by the resilient elements 10, 11.

In order to provide a multiple-action safety switching device 1, at least two additional resilient elements 12, 13 can be provided, the biasing force of which will also have to be overcome in order to switch the operating elements 2, 3 into the third switching position—position 6. The amount of force needed in order to move the operating elements 2, 3 from the second switching stage—position 5—into the third switching stage—position 6—will be greater than the force which must be applied in order to move the operating elements 2, 3 from the first switching stage—position 4—into the second switching stage—position 5. Accordingly, a clearly marked pushing point is provided on the safety switching device 1 proposed by the invention to enable controlled operation thereof and rule out the possibility of inadvertently pushing the operating elements 2, 3 harder into the third switching position—position 6—past the clearly indicated push marks. Any type of pre-biasing system known from the prior art may be used as the resilient elements 10 to 13 such as, for example, tension springs or compression springs of a spiral or leaf design or any other design and/or resilient blocks of synthetic material or rubber cushion springs. Furthermore, it would also be possible to provide a single-piece resilient element, having a multi-stage characteristic curve or which allows a progressively increasing resilient force.

The user can therefore readily see the respective state of the switch, even in the case of a multi-action safety switching device 1 and the relevant switching function associated with the switch status can be activated accurately and without error.

The respective switching stages—positions 4 to 6—of the operating elements 2, 3 are detected by at least two switching circuits 7, 8, which are built separately from one another and operate independently of one another so that if one of the evaluation circuits fails, the other circuit will remain in operation, thereby significantly increasing the operating safety of the safety switching device 1.

The position of the operating elements 2, 3, which is preferably set by the operator pushing with a finger or a foot, can be detected by at least one position-sensing device 14, 15 assigned to the operating elements 2, 3.

This being the case, a specific position-sensing device 14, 15 is preferably assigned to each of the operating elements 2, 3. In addition, the position-sensing devices 14, 15 are designed to detect all possible switching stages—positions 4 to 6—of the safety switching device 1, making reliable position-detection 14, 15 of various positions of the operating elements 2, 3 possible from the first through to the last switching stage—positions 4 to 6.

By preference, the position-sensing devices 14, 15 are provided in the form of a contactless or contact-free detection device 16, 17, in particular an optical detection device 16, 17. These optical detection devices 16, 17 preferably comprise several light sensors 18 to 21. The light sensors 18 to 21 may be deflected light sensors, in which case status is determined on the basis of an interrupted light beam, or as reflection sensors, in which case status is determined by light reflection. It would also be possible to use optical detection devices 16, 17, which work by evaluating the intensity of transmitted and, optionally, subsequently received signals, in particular optical signals, which can then be correlated to various possible positions 4 to 6 of the operating elements 2, 3. It is also possible to use position-sensing devices 14, 15 which permit a virtually infinite detection of position.

In this case, two each of the optical detection devices 16, 17 and two each of the light sensors 18, 19; 20, 21 are provided for each operating element. In particular, light sensors 18, 19 are assigned to operating element 2 and light sensors 20, 21 to operating element 3, in order to be able to detect the respective positions thereof.

Clearly, however, it would also be possible, instead of the optical detection devices 16, 17 and instead of the optical position-sensing devices 14, 15, to provide inductive and/or capacitative and/or pressure-sensitive, for example piezoelectric, position-sensing devices 14, 15 as a means of ascertaining the positions corresponding to the respective switching statuses of the operating elements 2, 3.

The light sensors 18 to 21 are preferably provided as miniaturised deflected light sensors having at least one light source 22 to 25 and at least one light-receiving element 26 to 29 assigned to the light sources 22 to 25.

This being the case, electric resistors for setting the operating points are provided for the light sources 22 to 25 and/or the light-receiving elements 26 to 29 in order to be able to feed the light sensors 18 to 21 from the existing supply voltage.

The light sensors 18 to 21 are preferably designed to irradiate light which is invisible to the human eye, in particular infrared light. Clearly, however, it would also be possible to provide light sensors 18 to 21 which emit light visible to the human eye.

The operating elements 2, 3 are preferably provided in the form of plate-type sliding members 30, 31 or the plate-type sliding members 30, 31 are moulded onto the operating elements adjusted by the operator. The plate-type sliding members 30, 31 each have at least one slit-shaped orifice 32, 33, through which the light irradiated by the light sources 22 to 25 is beamed when the operating elements 2, 3 are in the relevant positions and can be detected by light sources 22 to 25.

Accordingly, the operating element 2 is adjustably mounted between the light sources 22, 23 and the light-receiving elements 26, 27 thereof and the other operating element 3 is adjustably mounted between the light sources 24, 25 and the light-receiving elements 28, 29 thereof.

The orifices 32, 33 in the plate-type sliding members 30, 31 are positioned in such a way that when the operating elements 2, 3 are moved into the second switching stage—position 5—the light signals emitted by the first light sources 22, 24 are able to pass through the orifices 32, 33 onto the oppositely lying face of the sliding members 30, 31 and can be received, in a subsequent sequence, by the corresponding light-receiving elements 26, 28. When the operating elements 2, 3 are switched to the second switching stage—position 5—the light beam from the light sensors 18, 20 is not interrupted by the corresponding position of the operating elements 2, 3 and safety switching device 1 is the position in which a machine is authorised to perform critical movements or in which critical machine functions are permitted.

If, on the other hand, the operating elements 2, 3 and sliding members 30, 31 are in the first switching stage—position 4—the light sensors 18 to 21 are interrupted by the plate-type sliding members 30, 31. In particular, the light signals emitted by the light sources 22 to 25 in the first switching stage—position 4—of the operating elements 2, 3 can not reach the relevant light-receiving elements 26 to 29 since these are screened by the plate-type sliding members 30, 31.

The drawing in FIG. 1 depicts the safety switching device 1 in a position in which no authorisation is given to perform a specific function since the light-receiving elements 26 to 29 are unable to pick up the light emitted by the light sources 22 to 25. By contrast, the drawing of FIG. 2 depicts the safety switching device 1 in the state in which a critical machine movement or machine operation is permitted since the light beam from the first light sensors 18, 20 is not interrupted when the operating elements 2, 3 are in the second switching stage—position 5.

One advantage of the solution outlined above is that authorisation is in fact only issued if the light-receiving elements 26, 28 are able to receive a light signal so that, for example, if in the event of breakage of the sliding members 30, 31 acting as an optical diaphragm, authorisation status can not be reached for safety reasons, thereby ensuring that faulty operation is prevented. The authorisation status of the safety switching device 1 will therefore only be applied if a positive detection signal is supplied by the detection devices 16, 17. The orifices 32, 33 in the operating elements 2, 3 or in the sliding members 30, 31 are therefore arranged at a specific distance from the end region of the sliding members so that the end region at the end face of the sliding members 30, 31 interrupts the light sensors 18 to 21 in the first switching position—position 4—and the orifices 32, 33 are arranged in the region adjacent thereto, which allows light to be transmitted on to the light-receiving elements 26, 28 when the second switching stage—position 5—is assumed.

In a triple-action safety switching device, the region of the sliding members 30, 31 connecting with the orifices 32, 33 again does not allow the light to pass through. When switched to the third switching stage—position 6—the orifices 32, 33 in the sliding members 30, 31 are then so positioned that some of the light beams emitted from the light sources 22 to 25 can be picked up by the light-receiving elements 26 to 29 of the light sensors 18 to 21.

Instead of the operating elements 2, 3 being slidable relative to the position-sensing devices 14, 15, it would clearly also be possible for the operating elements to be mounted so that they are stationary whereas the position-sensing device 14, 15 could be mounted so that it is slidable relative to the operating elements 2, 3.

As explained above, two light sensors 18, 19; 20, 21, independent of one another, are provided for each operating element 2, 3 or each sliding member 30, 31. This being the case, the light sensors 18, 19 of the first pair of light sensors are arranged adjacent to one another in a direction of adjustment—arrow 34—of the operating elements 2, 3. The light sensors 18, 19 are therefore, aligned in such a way that these light sensors 18, 19 form a row running essentially parallel with the direction of adjustment—arrow 34—of the operating elements 2, 3 or the sliding members 30, 31, so that the light sensors 18, 19 can be arranged either without gaps between them or at a specific distance from one another. Similarly, the light sensors 20, 21 of the other pair of light sensors assigned to the sliding member 31 are arranged adjacent to one another in such a way that the direction in which they are aligned—arrow 35—runs substantially parallel with the direction of adjustment—arrow 34—of the operating elements 2, 3.

The fact that the direction of alignment—arrow 35—of the two light sensors 18, 19 and the direction of alignment—arrow 35—of the light sensors 20, 21 and the other pair of light sensors runs substantially parallel with the direction of adjustment—arrow 34—of the operating elements 2, 3 and the sliding members 30, 31, provides a simple way of determining in which of the two directions of adjustment—arrow 34—the operating elements 2, 3 have been shifted. From the alignment of light sensors 18, 19; 20, 21 for each sliding member 30, 31 described above, it is absolutely clear from which initial switching stage the operating elements 2, 3 have been switched to the current switching stage. For example, it is possible to tell whether the operating elements 2, 3 were moved from the second switching stage—position 5—into the third switching stage—position 6—denoting an emergency stop situation.

Similarly, it is possible to tell from the same or parallel layout or alignment of the light sensors 18, 19; 20, 21 for each pair of sensors along the direction of adjustment—arrow 34—whether the safety switching device 1 is in the third switching stage—position 6—and therefore will be forced back to the second switching stage—position 5—when the operating elements are released but will not allow authorisation for any critical machine function or will not allow the machine to perform any critical movement—even for a short period.

As opposed to the embodiment illustrated in FIG. 1, in order to design a very compact switching device 1, it is also possible to arrange the two flat sides of a printed circuit board receiving the sliding position-sensing devices 14, 15 substantially parallel with the two flat sides of the sliding members 30, 31, this printed circuit board being arranged between the two sliding members 30, 31. This being the case, the position-sensing device 14 co-operating with the sliding member 30 is arranged on one flat side of the printed circuit board and the other sliding member 31 co-operating with the position-sensing device 15 on the oppositely lying side. The detectors, in particular the light sensors 18, 19 of the position-sensing device 14 can then each be assigned one of the two longitudinal side edges of the sliding member 30 extending parallel with the adjusting direction—arrow 34—so that each longitudinal side edge of the sliding member 30 is assigned a detector. The same applies to the detectors or light sensors 20, 21 co-operating with the other sliding member 31. The detectors or light sensors 18, 19; 20, 21 for each sliding member 30, 31 are therefore arranged one after the other in the direction of adjustment—arrow 34.

Instead of providing several optical detection devices 16, 17 in a row one after the other as described above, it is clearly also possible to set up magnetic, inductive, piezoelectric detection devices 16, 17 or position-sensing devices 14, 15 or similar in a row and accordingly detect an adjusting direction—arrow 34—of the operating elements 2, 3.

As opposed to the arrangement described above, it would clearly also be possible to release several light sensors 18 to 21 in the second switching position—position 5—i.e. allow the light irradiated from the light sources 22 to 25 through the orifices 32, 33 to reach the light-receiving elements 26 to 29 and define a start authorisation in this status only to produce a high degree of operating safety based on the multiple arrangement and scanning option. In switching positions other than the second switching state—position 5—no start authorisation would be given and hence an emergency stop status would prevail, in which case a distinction can clearly be made on the basis of the signals from the position-sensing devices 14, 15 alone or also taking account of the respective adjustment position—arrow 34—of the operating elements 2, 3.

Each of the largely independently set-up position-sensing devices 14, 15 or optical detection devices 16, 17 is connected on the output side to its own evaluating device 36, 37. An independent evaluating device 36, 37 is therefore provided for each switching circuit 7, 8 or for each operating element 2, 3 In particular, the position-sensing device 14 or the detection device 16 is conductively connected to the evaluating device 36 whilst the other position detecting device 15 and the detection device 17 are conductively connected to the other evaluating device 37. Signal outputs 38, 39 of the detection device 16 are specifically conductively connected to evaluating device 36 and signal outputs 40, 41 of the detection device 17 to the other electronic evaluating device 37.

This being the case, the electric evaluating device 36 is constructed using an essentially different type of structure from that used for the electric evaluating device 37. In particular, the electric evaluating device 36 is constructed using a first technology or method whereas the second evaluating device 37 is built using a different technology or method. For example, the evaluating device 36 could be of a discrete structure, i.e. with individual electronic components connected to one another accordingly, such as resistors, capacitors, operational amplifiers and similar. Consequently, the evaluating device 36 would perform, for example, an analogue evaluation of the position signals issued by the detection device 16 whereas the other evaluating device 37 could use digital techniques and components to evaluate the position signals issued by the detection device 17 and would be built accordingly. A digital embodiment of the evaluating device 37 might be set up using a gating arrangement 42, for example, with digital gates connected to one another to suit the desired evaluation logic. The digital gates could be set up using a number of digital gate modules, known from the prior art, for example, which would be connected to one another in accordance with the desired processing logic and, for example, using AND, OR and/or inverter gates as well as all the other gates required to perform Boolean operations. By preference, however, the digital evaluating device 37 is provided in the form of a freely programmable gate array 42, such as the GAL-modules or PAL-modules known from the prior art, obviating the need to provide a plurality of individual discrete gating modules.

The analogue evaluating unit 36 may have discrete or integrated threshold switches or Schmitt trigger switches and/or comparator switches and/or driver stages, for example.

At least one electronic evaluating device 36, 37 is therefore assigned to each switching circuit 7, 8, designed to detect or determine the positions 4 to 6 of the operating elements 2, 3. Accordingly, the evaluating devices 36, 37 will evaluate the position signals issued by the detection devices 16, 17 independently of one another. The position signals corresponding to the respective switching states or to each of the positions 4 to 6 will be evaluated independently of one another in switching circuit 7 and in switching circuit 8 so that the evaluating devices each perform independent evaluations.

The evaluation results produced by the evaluating devices 36, 37, which will correspond to the respective switching stages—positions 4 to 6—will be issued by the evaluating devices 36, 37 to their own outputs. Consequently, each of the evaluating devices 36, 37 will have a start authorisation output 43, 44 and, as is the case, a respective emergency stop output 45, 46.

Depending on the respective switch position, the start outputs 43, 44 will therefore be activated or deactivated. By preference, the start outputs 43, 44 of the evaluating devices 36, 37 will be at a high potential if authorisation is given since the operating elements 2, 3 will be in the second switching stage—position 5. Provided the operating elements 2, 3 are in the first switching stage—position 4—a different, clearly distinguishable status will be sent to the start output 43, 44. Preferably, when authorisation is not being issued, the start outputs 43, 44 will be at a low level, thereby indicating that a non-authorised switching status prevails.

Clearly, however, it would also be possible to recognise an authorised or non-authorised switching status using inverse signal levels to those above.

In an emergency stop situation, the emergency stop outputs 45, 46 of the evaluating device 36, 37 are preferably at low level and at a high level if there is no emergency stop situation. Clearly, however, it would also be possible to use an inverse level arrangement as a means of distinguishing between an emergency stop situation and a normal situation.

Consequently, if the operating elements 2, 3 are in the third switching position, the emergency stop outputs 45, 46 of the evaluating device 36, 37 will issue the appropriate signal, preferably a low signal or no output signal.

To summarise, it can be said that if the emergency stop outputs 45, 46 are inactive or have no power applied to them, then there is an emergency stop situation and if they are active or power is applied to the emergency stop outputs 45, 46 a normal situation prevails. The advantage of this is that if an emergency stop output 45, 46 breaks down or if the supply voltage fails, the safety switching device 1 will continue to operate correctly. In particular, the embodiment described above will automatically indicate an emergency situation if there is a signal failure or the power is interrupted and it will not be possible for the operator to run the machine.

Each of the start outputs 43, 44 and the emergency stop outputs 45, 46 of the evaluating devices 36, 37 are electrically connected to a switching element 47 to 50. Each switching circuit 7, 8 therefore has at least two switch elements 47, 48; 49, 50, the two switch elements 47, 48 of the switching circuit 7 being different from the switch elements 49, 50 of the switching circuit 8. In particular, the switch elements 47, 48 are constructed using a different technology from that used for the switch elements 49, 50. Accordingly, the switch elements 47, 48 of the switching circuit 7, for example, are provided as bipolar transistors 51, 52, whilst the switch elements 49, 50 of the switching circuit 8 are field effect transistors (FET) 53, 54. The bipolar transistors 51, 52 are preferably provided as NPN-transistors but may also be provided as PNP-transistors. The field effect transistors 53, 54 are preferably self-locking field effect transistors 53, 54 but may clearly also be self-conducting field effect transistors.

The switch elements 47 to 50 co-operating with the start outputs 43, 44 and the emergency stop outputs 45, 46 are used to interrupt or shut off electrical operating current circuits connected across the switch elements 47 to 50. In particular, the drain terminals of the switch elements 49, 50 or the field effect transistors 53, 54 are connected respectively to the start output 44 or the emergency stop output 46 of the evaluating device 37. Similarly, the base terminal of the switch element 47 or the bipolar transistor 51 is connected to the start output 43 and the base terminal of the switching element 48 or bipolar transistor 52 is connected to the emergency stop output 45.

The two output terminals or the collector and the emitter of the switch element 47 form a first switch output 55 of the safety switching device 1, the two terminals of which are electrically connected across the switch element 47 if authorisation is issued, thereby forming a closed switch if authorisation is given. The other switch element 48 of the switching circuit 7 forms another switch output 56 of the safety switching device 1, whereby the two working circuit terminals of the switch 56 are electrically isolated from one another in the third switching stage, i.e. in an emergency off situation, and therefore correspond to an open switch, whereas when the status is normal, the two terminals are electrically and conductively connected to one another via the switch element 48.

Similarly, the switch element 49 forms a switch output 57 and the switch element 50 a switch output 58. When authorisation is given or when the operating elements 2, 3 are in the second switching stage—position 5—the terminals of the switch output 57 are electrically and conductively connected to one another across the switch element 49. When an emergency stop situation is indicated, the terminals of the other switch output 58 are electrically isolated from one another so that an open switch is formed which defines the emergency stop status. The switch outputs 57, 58 are therefore outputs of the switching circuit 8 of the safety switching device 1.

The switch elements 47 to 50, which are preferably semiconductor elements, naturally have a one-directional current throughput direction, enabling only one specific current flow direction at the switch outputs 55, 58. Preferably, however, each of the switch elements 47 to 50 has its own device 59 to 62, enabling a standard one-way flow of current across the switch elements 47 to 50, which are preferably semiconductor elements. By means of the devices 59 to 62 which are used by preference to standardise the polarity of the circuit voltage applied to the switch elements 47 to 50, it is also possible to produce non-polarised switch outputs 55 to 58. Using these devices 59 to 62 means that there is no need to take account of the polarity of the voltage or current flow direction to be applied to the switch outputs 55 to 58, thereby producing what is referred to as a potential-free switch contact or switch output 55 to 58.

The devices 59 to 62 for each switch element 47 to 50 are preferably provided in the form of a plurality of semiconductor diodes 63 to 66 in a bridge arrangement. The semiconductor diodes 63 to 66 disposed in the bridge circuit for each individual switch element 47 to 50 are therefore arranged to provide a type of bridge rectifier. The switch elements 47 to 50 co-operating with the devices 59 to 62 are therefore connected in parallel to the two pairs of diodes 67, 68 of each device 59 to 62. The pairs of diodes 67, 68 therefore consist of semiconductor diodes 63 to 66 connected in the same conducting direction. In particular, the diode pair 67 comprises semiconductor diodes 63, 66 connected in the same current flow direction whilst the other diode pair 68 comprises the two semiconductor diodes 64, 65 connected in the same current flow direction. By means of these devices 59 to 62, the electric current always flows in the same direction across the switch elements 47 to 50, regardless of the polarity of the voltage to be applied to the switch outputs 55 to 58, via the switch elements 47 to 50, which are preferably semiconductors.

Clearly, however, it would also be possible to set the switch elements 47 to 50 up as a relay, in which case they would respond to the evaluating devices 36, 37 and would form the switch outputs 55 to 58 on the side of the working current circuit. Set up as a relay, these switch elements 47 to 50 form potential-free switch contacts so that the polarity of the circuit voltage is irrelevant.

By preference, each switch element 47 to 50 also has a protective circuit 69 to 72 to protect the switch elements 47 to 50 from short-circuits in the working current circuits and/or overload. The protective circuits 69 to 72 are specifically designed to detect the current flowing across the switch elements 47 to 50. In particular, the protective circuits 69 to 72 are designed to monitor the electric current fed across the switch outputs 55 to 58. If the protective circuit 69 to 72 detects a state in which the maximum permissible working current has been exceeded, which could occur in the event of a short-circuit in a consumer unit connected to the switch outputs 55 to 58, the switch element 47 to 50 to which the unacceptably high working current is being applied is switched off and the working current circuit interrupted. Similarly, the protective circuit 69 to 72 will detect an unacceptably high circuit voltage on the switch outputs 55 to 58.

If, for example, the protective circuit 69 to 72 detects an unacceptably high working current across the switch elements 47 to 50, the control input of the switch elements 47 to 50 can be controlled by the protective circuit 69 to 72 accordingly so that the flow of current across the corresponding switch element 47 to 50 is interrupted and the unacceptably high current can not cause any damage to the respective switch elements 47 to 50. This being the case, the protective circuit 69 to 72 can be conductively connected to the evaluating device 36, 37 on the one hand and to the device 59 to 62 on the other in order to detect the respective short-circuit or overload states and take whatever measures are needed to prevent the switch elements 47 to 50 from being damaged.

The protective circuits 69 to 72 can be set up as simple voltage monitoring devices, which, in the event of an unacceptably high voltage as indicated by a sensing resistor in the working current circuit of the switch elements 47 to 50, will disconnect the unacceptably high current and therefore lead to a shut-down of the switch element 47 to 50.

By preference, the switch outputs 55 to 58 of the safety switching device 1 preferably form the interface with the control electrics of the machine to be controlled by means of the safety switching device 1 or by means of the authorisation switch and are therefore preferably provided as terminals. The multiple, in particular two-fold detection, evaluation and output of the desired switching function provided by the safety switching device 1 increases safety in the event of a fault or operating safety significantly. External influences can generate multiple faults or cause a knock-on effect on the safety switching device 1 due to the fact that the structure of the switching circuit 7 differs from that of the switching circuit 8. If one of the switching circuits 7 or 8 is affected, the other switching circuit remains independent, so that the safety switching device 1 continues to function correctly, thereby achieving safety to single-mode standard.

The switch outputs 55 to 58 can be wired by an electrician to obtain safety to single-mode standard. Clearly, however, it would also be possible to connect the switch outputs 55 to 58 or the independently constructed switching circuits 7, 8 directly to the circuit board on which the electrical components of the safety switching device 1 are mounted.

To this end, the switch elements 48, 50 co-operating with the emergency stop outputs 45, 46 or the corresponding switch outputs 56, 58 of the first switching circuit 7 and the second switching circuit 8 should specifically be connected in series. In particular, the switch outputs 56, 58 operating as emergency stop outputs should be connected in series so that if one of the switch elements 48, 50 fails it will still be possible to break the current circuit.

Similarly, the switch elements 47, 40 co-operating with the start outputs 43, 44 or the corresponding switch outputs 55, 57 of the first switching circuit 7 and the second switching circuit 8 should be connected in parallel. By connecting the switching element 47, 49 acting as a breaker in parallel in this way, if one switch element 47, 48 fails, the other switch element 47 or 48 will continue to be active so that authorisation can still be given.

The switch elements 47, 49 connected in parallel are also connected in series to the serially connected switch elements 48, 50 so that all four switch elements 47 to 50 can be connected together as described above. The circuit layout of the switch elements 47 to 50 described above is provided as a means of responding to at least one actuator 73, e.g. a relay coil. In particular, the actuator 73 can be connected to or isolated from a corresponding power supply by means of this switch arrangement. Clearly, however, it would also be possible to use an electric motor, a hydraulic pump or similar as an actuator 73.

Optionally, it is also possible, instead of the arrangement having several operating elements 2, 3 or sliding members 30, 31, to provide only one sliding member which co-operates with several position-sensing devices 14, 15 which are independent of one another, without having to make a serious compromise from the safety point of view, since the likelihood of the mechanical sliding member failing is relatively low. This individual mechanical sliding member could have several orifices 32, 33, which would co-operate with the position-sensing devices 14, 15 or detection devices 15, 16 in the respective switch positions.

However, it would also be possible to provide each switching circuit 7, 8 with a single position-sensing device 14, 15, in which case these position-sensing devices 14, 15 would issue at least one electric signal of varying shapes depending on the position 4 to 6 of the operating elements 2, 3. For example, it would be possible, depending on the signal shape issued by the position-sensing device 14, 15, in particular depending on the frequency, amplitude and/or phase shift of the signals, to lock onto the corresponding position 4 to 6 of the operating elements 2, 3. In particular, the voltage amplitude and/or frequency of an electric signal emitted by a position-sensing device 14, 15 could be used to lock onto the respective switch position—position 4 to 6.

For the sake of good order, it should be pointed out that in order to provide a clearer understanding of the workings of the safety switching device proposed by the invention, the diagram of it and its components parts is not to scale and/or enlarged and/or reduced.

The various solutions proposed by the invention with respect to the initially stated objective can be taken from the description.

Above all, the individual embodiments of the subject matter illustrated in FIGS. 1, 2 represent solutions proposed by the invention. The specific objectives and solutions which they are intended to depict can be taken from the detailed description of these drawings.

What is claimed is:

1. Safety switching device for electrically controlled machines used in combination with the control elements of the machine control-system itself during hand or manual operation, in which the multi-stage safety switching device has several channels or several switching circuits and the switching circuits have at least one operating element which can be adjusted by an operator depending on the desired switching function, characterised in that each switching circuit (7, 8) is assigned at least one position-sensing device (14, 15), comprising in particular contactless detection devices (16, 17) for detecting, at any time, the position (4 to 6) of the operating elements (2, 3) corresponding to the respective switching stages, which can be adjusted by the operator.

2. Safety switching according to claim 1, characterised in that each switching circuit (7, 8) is assigned at least one electronic evaluating device (36, 37) for detecting or determining positions (4, 6) of at least one operating element (2, 3), which can be adjusted by the operator, the evaluation operations of the evaluating devices (36, 37) being independent of one another.

3. Safety switching device according to claim 2, characterised in that the evaluating devices (36, 37) are built with electrical parts or components based on different technologies.

4. Safety switching device according to claim 2, characterised in that the evaluating device (36) of the first switching circuit (7) is of a different circuit design than that of the evaluating device (37) of the second switching circuit (8).

5. Safety switching device according to claim 2, characterised in that each evaluating device (36, 37) is connected respectively to at least one electric switch element (47 to 50) on the output side.

6. Safety switching device according to claim 5, characterised in that at least one of the switch elements (47 to 50) has a protective circuit (69 to 72) to protect against overload and/or short circuit currents.

7. Safety switching device according to claim 6, characterised in that the protective circuit (69 to 72) monitors the electric power conducted across the switch elements (47 to 50) and is connected to the evaluating devices (36, 37) and/or with the start and/or emergency stop outputs (43, 44; 45, 46) thereof.

8. Safety switching device according to claim 5, characterised in that the switch elements (47, 48) of the first switching circuit (7) are based on a different technology from that of the switch elements (49, 50) of the second switching circuit (8).

9. Safety switching device according to claim 5, characterised in that the switch elements (47 to 50) are contactless switching members, in particular semiconductor elements.

10. Safety switching device according to claim 9, characterised in that the switch elements (47 to 50) formed by semiconductor elements co-operate with a device (59 to 62) for setting a standard flow direction of the switching current across the switch elements (47 to 50).

11. Safety switching device according to claim 10, characterised in that the device (59 to 62) comprises a plurality of semiconductor diodes (63 to 66) in a bridge arrangement.

12. Safety switching device according to claim 10, characterised in that the device (59 to 62) comprises two pairs of diodes (67, 68) connected in the same direction of current flow and the respective switch element (47 to 50) is connected to the two pairs of diodes (67, 68) in parallel.

13. Safety switching device according to claim 12, characterised in that each pair of diodes (67, 68) comprises two semiconductor diodes (63, 66; 64, 65) connected in a same conducting direction and switch outputs (55 to 58) of the safety switching device (1) between the serially connected semiconductor diodes (63, 66; 64, 65) of each pair of diodes (67, 68).

14. Safety switching device according to claim 9, characterised in that the switch elements (47 to 50) formed by semiconductor elements co-operate with a device (59 to 62) for setting a standard polarity of the switching current applied to the switch elements (47 to 50).

15. Safety switching device according to claim 5, characterised in that the switch elements (47, 48) of the first switching circuit (7) are bipolar transistors (51, 52) and the switch elements (49, 50) of the second switching circuit (8) are field effect transistors (53, 54).

16. Safety switching device according to claim 2, characterised in that each evaluating device (36, 37) has a start authorisation output (43, 44) and an emergency stop output (45, 46).

17. Safety switching device according to claim 16, characterised in that the start output (43, 44) and the emergency stop output (45, 46) of each evaluating device (36, 37) is connected to a respective switch element (47 to 50).

18. Safety switching device according to claim 17, characterised in that the emergency stop outputs (45, 46) co-operating with the switch elements (47, 50) of the first switching circuit (7) and the second switching circuit (8) are connected to operate in series.

19. Safety switching device according to claim 18, characterised in that the parallel connected switch elements (47, 49) are connected in series to the serially connected switch elements (48, 50) and are connected to or isolated from a current supply across this switching array by means of at least one actuator, e.g. a relay.

20. Safety switching device according to claim 17, characterised in that the start outputs (43, 44) co-operating with the switch elements (47, 49) of the first switching circuit (7) and the second switching circuit (8) are connected to operate in parallel.

21. Safety switching device according to claim 2, characterised in that the electronic evaluating device (36) of the first switching circuit (7) is of a different technological structure from that of the evaluating device (37) of the second switching circuit (8).

22. Safety switching device according to claim 2, characterised in that the first switching circuit (7) has an analogue evaluating device (36) and the second switching circuit (8) a digital evaluating device (37) for the electric signals, in particular light sensor signals, applied to signal outputs (38 to 41) of the position-sensing devices (14, 15).

23. Safety switching device according to claim 2, characterised in that one of the electronic evaluating devices (36, 37) incorporates at least one threshold circuit and/or a Schmitt trigger circuit.

24. Safety switching device according to claim 23, characterised in that the other electronic evaluating device (36, 37) has a plurality of digital gate arrays (42) for evaluating the signals of the position-sensing devices (14, 15).

25. Safety switching device according to claim 2, characterised in that one of the electronic evaluating devices (36, 37) is a freely programmable gate array (42) with an evaluating logic programmed accordingly.

26. Safety switching device according to claim 1, characterised in that each switching circuit (7, 8) is assigned at least two position-sensing devices (14, 15).

27. Safety switching device according to claim 1, characterised in that each switching circuit (7, 8) is assigned its own independent operating element (2, 3).

28. Safety switching device according to claim 1, characterised in that the operating elements (2, 3) are kinetically coupled with one another.

29. Safety switching device according to claim 1, characterised in that the position-sensing devices (14, 15) are optical detection devices (16, 17).

30. Safety switching device according to claim 1, characterised in that the position-sensing devices (14, 15) are light sensors (18 to 21).

31. Safety switching device according to claim 1, characterised in that the position-sensing devices (14) assigned to the first operating element (2), provided in particular as first light sensors (18, 19), and/or the position-sensing devices (15) assigned to the other operating element, provided in particular as other light sensors (20, 21), are arranged in succession following a direction—arrow 34—in which the operating elements (2, 3) are adjusted.

32. Safety switching device according to claim 1, characterised in that each operating element (2, 3), is kinetically coupled with a plate-type sliding member (30, 31) having an orifice (32, 33).

33. Safety switching device according to claim 32, characterised in that the sliding members (30, 31) operating as optical apertures are mounted so that they can be adjusted relative to their respective light sensors (18, 19; 20, 21).

34. Safety switching device according to claim 1, characterised in that the position-sensing devices (14, 15) are inductive and/or capacitative and/or pressure-sensitive or piezoelectric detection devices (16, 17).

* * * * *